United States Patent [19]

Wakasugi

[11] Patent Number: 4,935,692
[45] Date of Patent: Jun. 19, 1990

[54] VECTOR AMMETER HAVING DIGITAL SIGNAL PROCESSING UNIT

[75] Inventor: Tomio Wakasugi, Hachioji, Japan

[73] Assignee: Hewlett-Packard Company, Palo Alto, Calif.

[21] Appl. No.: 278,134

[22] Filed: Nov. 30, 1988

[30] Foreign Application Priority Data

Nov. 30, 1987 [JP] Japan .................... 62-302927

[51] Int. Cl.[5] ............. G01R 27/00; G01R 19/25
[52] U.S. Cl. .......................... 324/607; 324/691; 324/99 D; 324/123 C
[58] Field of Search ............ 324/62, 64, 57 R, 123 R, 324/123 C, 99 D, 99 R

[56] References Cited

U.S. PATENT DOCUMENTS 4,481,464  11/1984  Noguchi et al. ............. 324/57 R X

OTHER PUBLICATIONS

Maeda, An Automatic, Precision 1 MHz Digital LCR Meter, hp Journal, Mar. 74, pp. 2–9.
Hashimoto et al., An Automatic Wide Range Digital LDR Meter, hp Journal, Sep. 76, pp. 9–15.

Primary Examiner—Reinhard J. Eisenzopf
Assistant Examiner—Jack B. Harvey
Attorney, Agent, or Firm—William C. Milks, III

[57] ABSTRACT

An improved type of vector impedance measuring instrument is disclosed. The vector impedance is a vector current relative to (or normalized to) a pertinent voltage. A transducer for converting the impedance to corresponding current and voltage includes a digital signal processing unit. The vector value of the current is derived from parameter values set in the digital signal processing unit. This configuration eliminates a conventional vector ratio detector, which conventionally followed the transducer, saves cost, reduces size, and achieves high performance. Also, algorithms implemented in the digital signal processing unit are easily modified for a variety of transfer functins phase compensation, and corrections.

16 Claims, 5 Drawing Sheets

FIG_1

FIG_2

FIG_ 3

VECTOR AMMETER HAVING DIGITAL SIGNAL PROCESSING UNIT

BACKGROUND OF THE INVENTION

The present invention relates to a wideband, high-sensitivity vector ammeter. Vector ammeters according to the invention can be used as wideband, high-sensitivity voltmeters and impedance meters The vector ammeter referred to herein is a measuring instrument which produces electric current in a certain ratio to other current or voltage of the same frequency.

Wideband, high-sensitivity vector ammeters find wide application. When a resistor is connected to the input terminal of such an ammeter to convert voltage into electric current, it is possible to know the resistance value of the resistor and to measure the input voltage.

Figure 5:
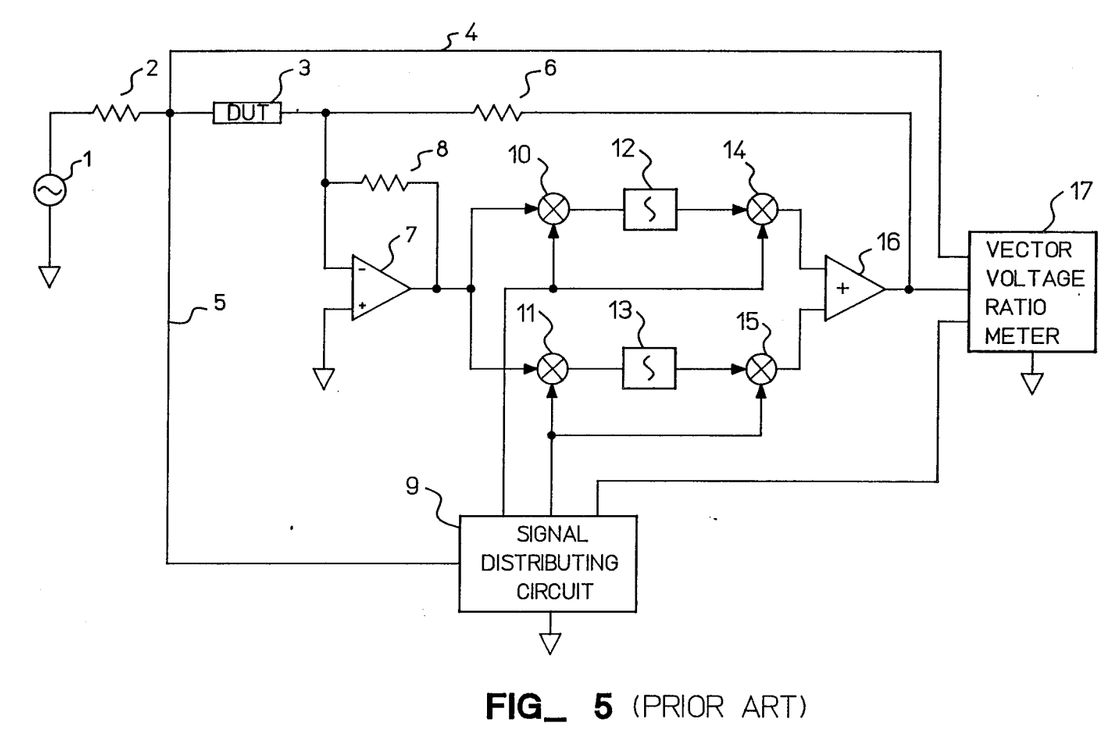
FIG. 5 is a block diagram of a prior art vector ammeter.

Also, wideband, high-sensitivity vector ammeters are used as main portions of wideband half bridge circuits of electronic element measuring instruments, such as the HP 4274A multifrequency LCR meter manufactured by Yokogawa Hewlett-Packard Co., Ltd. FIG. 5 shows a vector ammeter employed as an impedance measuring instrument which uses such a wideband half bridge circuit.

Referring to FIG. 5, an AC signal source 1 produces an AC signal which is passed through a source resistor 2 and divided into three components. One of these components is fed to a vector voltage ratio meter 17 through a first path 4. Another component is furnished to the inverting input terminal of an amplifier 7 through a device 3 being measured. The remaining component is sent to a signal distributing circuit 9 through a path 5.

The amplifier 7 and a feedback resistor 8 form a current-to-voltage converter circuit to which an electric current is applied via the measured device 3 and a reference resistor 6. The converter circuit converts the input current into a voltage that is fed to one terminal of each one of phase-sensitive detectors 10 and 11. The other input terminals of the detectors 10 and 11 are excited with driving signals which are delivered from the signal distributor 9. These driving signals have the same frequency as the aforementioned AC signal and are 90° out of phase with each other.

The outputs from the phase-sensitive detectors 10 and 11 are smoothed and amplified by integrators 12 and 13, respectively, and applied to one terminal of modulators 14 and 15, respectively. The modulators 14 and 15 modulate the 90° out-of-phase signals which are applied to the phase-sensitive detectors 10 and 11. The modulated signals are applied to an adder 16. The output from the adder 16 is fed to the inverting input terminal of the amplifier 7 via the reference resistor 6.

The network is designed so that all the electric current flowing through the measured device 3 passes through the reference resistor 6. The inverting input terminal of the amplifier 7 forms a virtual ground point.

The vector voltage ratio meter 17 receives the output from the adder 16 and the AC voltage which is passed through the path 4 to energize the measured device 3. The meter 17 calculates the vector ratio of the output from the adder 16 to the AC voltage passed through the path 4. The calculation of the vector voltage ratio is carried out by the above-described HP 4274A meter or other instrument and is well-known. Therefore, description of the calculation is omitted herein. Of course, a vector ratio is expressed in terms of the ratio of one of two inputs to the other and their phase difference.

Let $V_3$ be the AC voltage for energizing the measured device 3 and $V_{16}$ be the AC voltage delivered from the adder 16. The impedance Z of the measured device 3 is given by $$Z = -\left[\frac{V_3}{V_{16}}\right]R \tag{1}$$

provided the resistance $R_6$ of the reference resistor 6 is a parameter. In the above equation, the inside of [ ] expresses the vector voltage ratio. Similarly, by taking the vector ratio of current $I_3$ flowing through the measured device 3 to $V_3$, we have $$\frac{I_3}{V_3} = \frac{1}{Z} = -\frac{1}{R}\left[\frac{V_{16}}{V_3}\right] \tag{2}$$

Generally, the vector voltage ratios of $V_3$ and $V_{16}$ to the third input $V_9$ supplied from the signal distributor 9 are calculated. Then, the vector voltage ratio of $V_{16}$ to $V_3$ is calculated. In case of Eq. (2), the vector current is admittance.

The prior art techniques described thus far have the following disadvantages. Since a vector voltage ratio meter is needed, the cost and the space requirements are great. Furthermore, the vector voltage ratio cannot be calculated until the bridge portion shown in FIG. 5 excluding the vector voltage ratio meter stabilizes. Therefore, a long time is taken for the measurement. Also, it is difficult to stabilize the bridge portion at radio frequencies.

Accordingly, it is an object of the invention to provide a small-sized, high-speed, inexpensive vector ammeter which uses a digital signal processing unit and thus dispenses with a vector voltage ratio meter, thereby eliminating the foregoing disadvantages.

SUMMARY OF THE INVENTION

According to one embodiment of the invention, a digital signal processing unit, which is generally fabricated in the form of an integrated circuit, is disposed in the forward amplification path of a bridge portion. The digital signal processing unit is controlled by a microprocessor and supplied with a calibration coefficient for the bridge portion, as well as some parameters needed for stabilization of operation.

The digital signal processing unit gives to the microprocessor the internal state variables which are taken when the bridge is at balance. Thus, desired values of Z and 1/Z can be calculated. If the digital signal processing unit incorporates a microprocessor, these calculations can be performed inside the digital signal processing unit.

BRIEF DESCRIPTION OF THE DRAWINGS

It is to be noted that portions having like functions and like performance are denoted by like reference numerals throughout FIGS. 1-5.

DETAILED DESCRIPTION OF THE PREFERRED EMBODIMENTS

Figure 1:
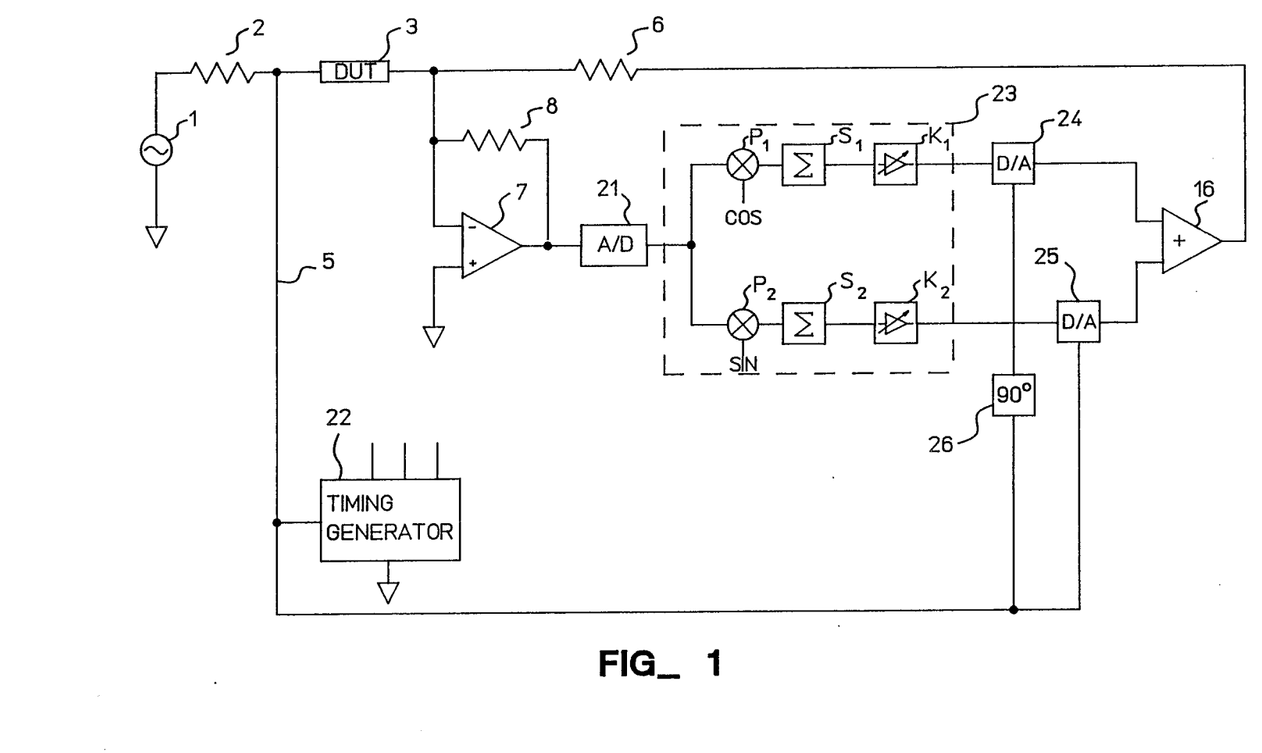
FIGS. 1 and 2 are block diagrams of vector ammeters constituting first and second embodiments, respectively, of the invention.

Referring to FIG. 1, the output from an amplifier 7 is converted into digital form by an analog-to-digital (A/D) converter 21 and supplied to a digital signal processing unit 23. This processing unit 23 includes digital phase-sensitive detectors $P_1$ and $P_2$, accumulators $S_1$ and $S_2$, and gain adjusters $K_1$ and $K_2$ that set the gains. The accumulators $S_1$ and $S_2$ act as digital integrators which simulate analog integrators. The outputs from the gain adjusters $K_1$ and $K_2$ of the digital signal processing unit 23 are applied to quadrant multiplication type digital-to-analog (D/A) converters 24 and 25, respectively. Each of the converters 24 and 25 receives the AC voltage for energizing the measured device 3 and a signal voltage shifted in phase by 90° with respect to the AC voltage. The outputs from the converters 24 and 25 are added up by an adder 16. A 90° phase shifter 26 shifts the phase of its input signal by 90°. The output from the shifter 26 is fed to the D/A converter 24.

A digital cosine wave is applied to the digital phase-sensitive detector $P_1$. A digital sine wave, which is either produced inside the digital signal processing unit 23 or received from the outside, is supplied to the digital phase-sensitive detector $P_2$. Each of the detectors $P_1$ and $P_2$ calculates the product of the respective cosine and sine input and the output from the A/D converter 21.

A timing signal needed for the vector ammeter is produced by a timing generator 22 in synchronism with a driving voltage $V_3$. The timing signal is distributed to digital devices and devices including both analog and digital elements, the devices needing the signal.

Preferably, the conversion rate of the A/D converter 21 is sufficiently larger than the Nyquist rate of the input signal, i.e., a sufficiently high oversampling frequency is used.

In the first embodiment shown in FIG. 1, the vector current ratio is found irrespective of variations in the level of the output from the signal source 1, because the signals applied to the D/A converters 24 and 25 vary in proportion to $V_3$, and because it is not necessary for the converters 24 and 25 serving to adjust the amplitudes of signals to respond to every instantaneous value of signals having the same frequency as the driving AC voltage. However, the two multiplication type D/A converters 24 and 25 are needed.

Figure 2:
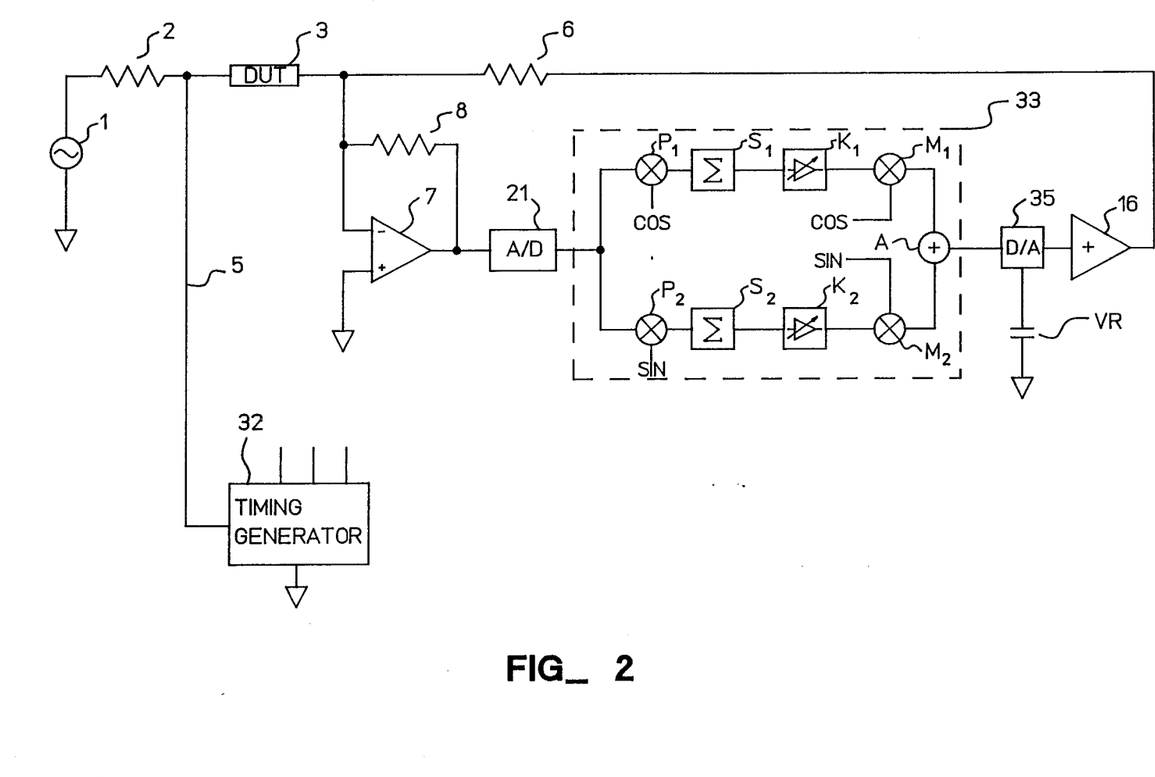

Referring to FIG. 2, a digital signal processing unit 33 operates in synchronism with a timing generator 32 which is similar to the timing generator 22. The digital signal processing unit 33 incorporates demodulating digital modulators $M_1$ and $M_2$ and a digital adder A. The output from the adder A is converted into alternating current proportional to a reference DC voltage VR by a D/A converter 35. The internal configuration of the digital signal processing unit 33 equivalently represents the algorithm effected by the digital signal processing unit 33. Of course, the invention is not limited to the illustrated configuration. Where forward amplification is made, if phase adjustment is made, paths (not shown) extending from the outputs of $S_1$ and $S_2$ to the outputs of $K_1$ and $K_2$ are added. Signals flowing through the added paths are multiplied by factors similarly to the case of $K_1$ and $K_2$.

In the second embodiment shown in FIG. 2, variations in the level of the output from the signal source 1 directly induce error, and so frequent calibration is needed. Also, the D/A converter 35 is required to respond to every instantaneous value of the alternating current, and hence it must operate rapidly. However, only one D/A converter 35 is needed.

Figure 3:
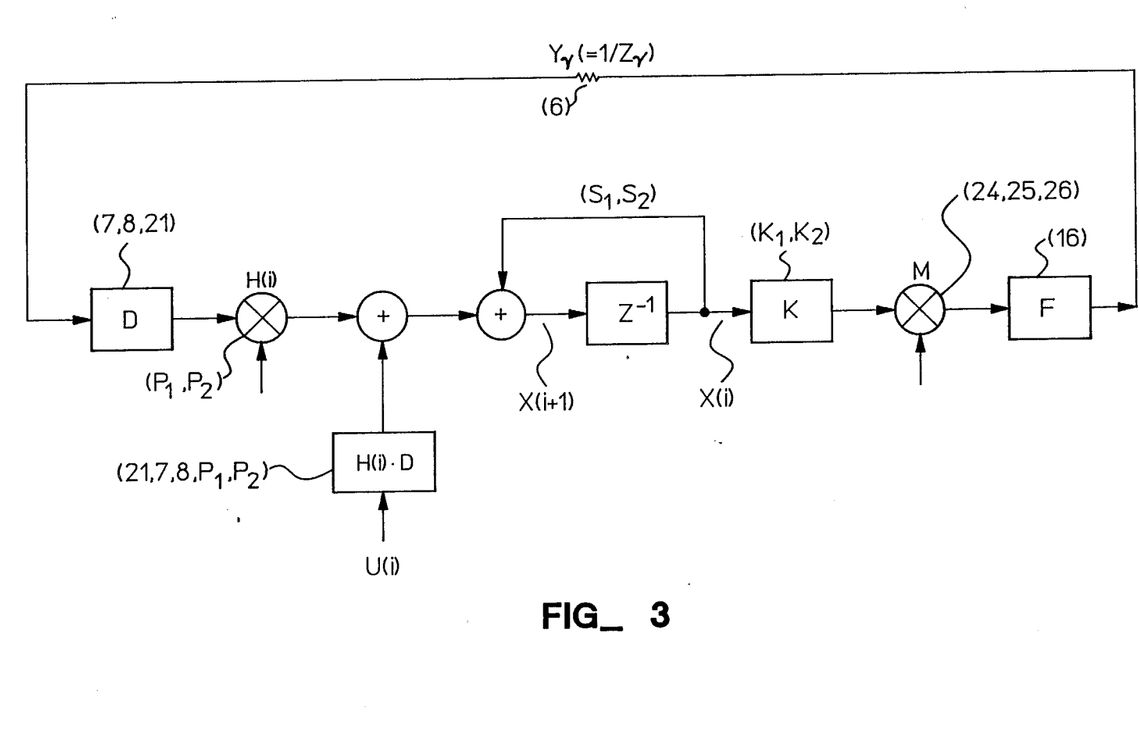
FIG. 3 is a diagram illustrating a system model of the first and second embodiments shown in FIGS. 1 and 2.

FIG. 3 shows a system model of the first and second embodiments. Equations described below can be derived by using the well-known Z transformation. The reference numerals in the parentheses shown in FIG. 3 illustrate the correspondence between the reference numerals used in FIG. 1 and arithmetic operators.

The input current U (i), the outputs x (i) and x (i+1) from the accumulators are vectors of two rows and one column whose elements are orthogonal components. They can be state variables of the system. Each operator is represented in the form of a matrix of two rows and two columns.

Two succeeding discrete instants of time are indicated by i and (i+1). $Z^{-1}$ expresses a delay. Using U (i) and x (i) obtained at instant i, the output x (i+1) from each accumulator at instant (i+1) is given by $$x(i+1) = A(i)x(i) + B(i)U(i) \quad (3)$$

where $A(i) = H(i)D\, Y_\gamma FMK + I$, $B(i) = H(i)D$, and
$H(i) =$ $$\begin{bmatrix} \cos(iW)\cos(iW + \theta_c) & \cos(iW)\sin(iW + \theta_s) \\ \sin(iW)\cos(iW + \theta_c) & \cos(iW)\sin(iW + \theta_s) \end{bmatrix}$$

In the above equations, I is a unit matrix, W is equal to $2\pi/n$, n is the number of samples, i.e., the number of discrete instants of time, taken within one period of the frequency of the driving voltage, and $\theta_c$ and $\theta_s$ are phase parameters.

Using U (i), a sampled value $I_3$ (i) of the measured current is given by $$I_3(i) = U_c(i)\cos \omega_0 i + U_s(i)\sin \omega_0 i$$

where $$U(i) = \begin{bmatrix} U_c(i) \\ U_s(i) \end{bmatrix}.$$

and $\omega_0$ is the angular frequency of the alternating current.

We are now discussing electric currents varying within a narrow band, and, therefore, it is assumed that U (i) changes sufficiently slowly.

When step-function signal U (i), that is assumed to be constant, is applied at i=0, a formula representing gradual change during one period of alternating current is given by $$
\begin{aligned}
x(n) = \; & A(n-1)A(n-2)\ldots A(1)A(0)x(0) + \\
& A(n-1)A(n-2)\ldots A(1)B(0)U(0) + \\
& \cdot \\
& \cdot \\
& \cdot + \\
& A(n-1)B(n-2)U(n-2) + \\
& B(n-1)U(n-1)
\end{aligned}
$$

Therefore, the state equation for one period is given by $$x(n) = \overline{A}\, x(0) + \overline{B}\, U(0) \tag{4}$$

where $$\overline{A} = \prod_{i=0}^{n-1} A(i)$$

$$\overline{B} = (\overline{A} - 1)(Y_\gamma FMK)^{-1}$$

By marking time every period of the driving AC voltage, we get $$x(k+1) = \overline{A}(k) + \overline{B}\, U(k) \tag{5}$$

where k is the period number.

Finite settling time response is possible if the intrinsic value of $\overline{A}$ can be made zero. How to select $\overline{A}$ is a matter of design, and the theory is well-known. By correctly selecting $\overline{A}$ and using Eqs. (4) and (5), the final value $x(\infty) = x(k+1) = x(k)$ of step response is given by $$x(\infty) = -(Y_\gamma FMK)^{-1} U(\infty)$$

Thus, $$U(\infty) = -(Y_\gamma FMK) x(\infty) \tag{6}$$

If an offset $\epsilon_O$ that is represented by a vector of two columns and one row exists because of signal leakage from the phase-sensitive detectors or for other reasons, then we find $$U(\infty) = -(Y_\gamma FMK) x(\infty) + \epsilon_0 \tag{7}$$

It can be seen from Eq. (7) that if $Y_\gamma FMK$ and $\epsilon_0$ are calibrated, $U(\infty)$ can be calculated from $x(\infty)$. The calibration is made, using the relationships $U(\infty)_0 = 0$, $U(\infty)_1 = [U_c, 0]T$, and $U(\infty)_2 = [0, U_s]T$, where T is the transpose of the matrix. $U(\infty)_0$ is obtained by disconnecting the measured device 3 (FIGS. 1 and 2) from the circuit. $U(\infty)_1$ and $U(\infty)_2$ are given by a reference resistance and a reference capacitance, respectively.

Disconnection of the measured device 3 (FIGS. 1 and 2) may not suffice. It may be necessary to shield the input terminals of the amplifier 7 (FIGS. 1 and 2).

In the above-described embodiments, the digital signal processing units act to perform accumulation and add gains after phase-sensitive detection. An algorithm can be easily implemented which makes a dynamic compensation for loss caused by insertion of an antialiasing filter into the input of the A/D converter or makes a compensation for RF phase shift. Further, modifications similar to modifications in the case of analog systems are possible. For example, a heterodyne circuit can be positioned before the A/D converter to lower the frequency of the input to the A/D converter.

Figure 4:
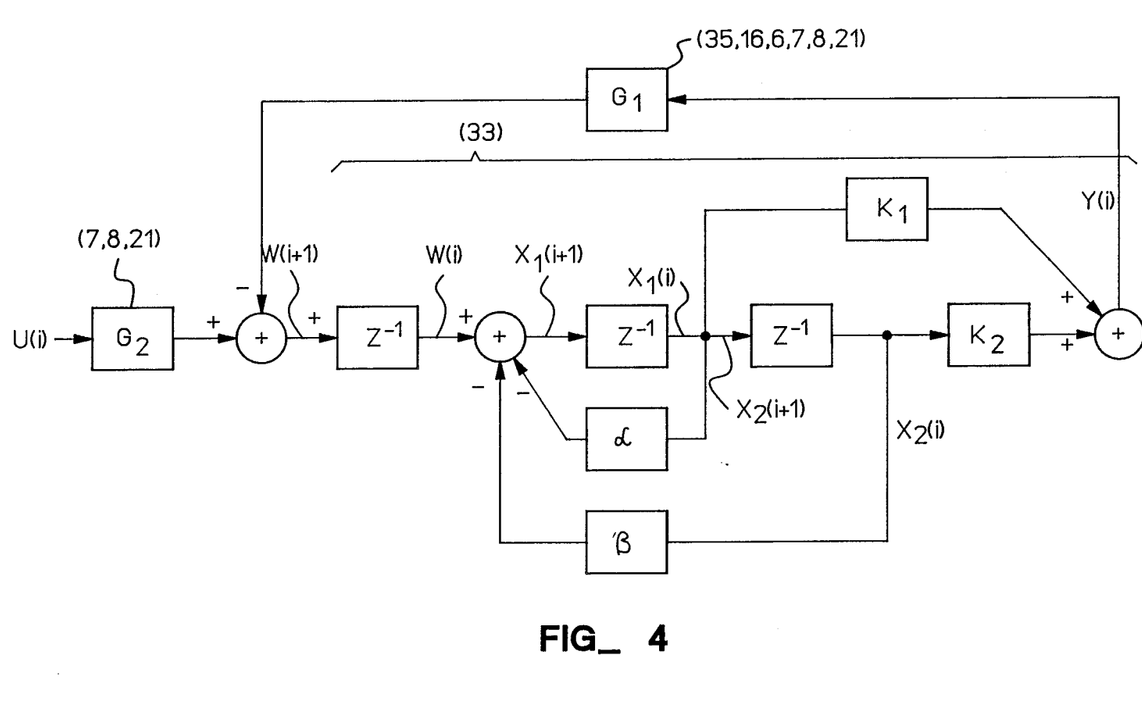
FIG. 4 is a diagram illustrating a system model of a more general, third embodiment of the invention.

FIG. 4 shows a model in which the digital signal processing unit 33 shown in FIG. 2 is realized by a second-order cyclic filter algorithm. Differing from the model shown in FIG. 3, state variables x(i), U(i), and W(i) are samples of instantaneous values of sinusoidal signal waves of the same frequency as the AC voltage driving the measured device. In FIG. 4, W(i) expresses a delay introduced when the output from the A/D converter is sampled by the digital signal processing unit 33 (FIG. 2). We will find a transfer function by making use of Z transformation.

Assuming $G_1 = G_2 = 1$, the state equations are given by $$
\begin{bmatrix} x_1(i+1) \\ x_2(i+1) \\ W(i+1) \end{bmatrix} = \begin{bmatrix} -\alpha & -\beta & 0 \\ 1 & 0 & 0 \\ -K_1 & -K_2 & 0 \end{bmatrix} \begin{bmatrix} x_1(i) \\ x_2(i) \\ W(i) \end{bmatrix} + \begin{bmatrix} 0 \\ 0 \\ 0 \end{bmatrix} U(i) \tag{8}
$$

$$
Y(i) = (K_1, K_2, 0) \begin{bmatrix} x_1(i) \\ x_2(i) \\ W(i) \end{bmatrix} \tag{9}
$$

Therefore, $$\frac{Y(Z)}{U(Z)} = \frac{K_1 Z + K_2}{Z(Z^2 + \alpha Z + \beta) K_1 Z K_2} \tag{10}$$

When the measured angular frequency is $\omega_0$ and the sampling period is T, internal model conditions which reduce the steady-state error down to zero are set so that $\alpha = -2\cos(\omega_0 T)$ and $\beta = 1$. $K_1$ and $K_2$ are calculated in the manner described below.

First, desired conjugate complex poles $\lambda_1$ and $\lambda_2$ are selected so that $$\lambda_1 = \gamma e^{jWT} \tag{11}$$

$$\lambda_2 = \gamma e^{-jWT}$$

Then we have $$K_1 = (\gamma - 1)(\gamma + 1 - 4\gamma\cos^2\omega_0 T) \tag{12}$$

$$K_2 = -2(1-\gamma)\gamma^2 \cos \omega_0 T$$

Consequently, a real pole $\lambda_3$ is given by $$\lambda_3 = 2(1-\gamma) \cos \omega_0 T \tag{13}$$

In order to stabilize the vector ammeter, the relation $|\lambda_3| < 1$ must hold. If $\omega_0 T$ is sufficiently small, i.e., samples are taken at short intervals, then $\cos \omega_0 T = 1$. Therefore, $\gamma$ should be selected so as to satisfy the relation $$0.5 < \gamma < 1 \tag{14}$$

In steady state, $U(i) = Y(i)$. If $G_1$ and $G_2$ are not equal to unity, we get $$U(i) = G_{2hu} - 1\, G_1\, Y(i) \tag{15}$$

In either case, U(i) can be calculated from Y(i).

U(i) and Y(i) are instantaneous values. During certain integral periods, every instantaneous value of Y(i)

is stored in a memory. This set of data is subjected to digital phase detection and digital integration to calculate the amplitude and the phase of Y (i). Therefore, the amplitude and the phase of the input current U (i) can be found from Eq. (15).

Calibration is performed in the same way as in the case of the model shown in FIG. 3. In this case, however, digital phase detection is accurate, and so current 0 and cos $\omega_0 t$ or sin $\omega_0 t$ are input for calibration.

As can be understood from the embodiments described above, the practice of the invention dispenses with a vector voltage ratio meter, thus reducing the number of circuit components. This decreases the cost and allows rapid measurement.

Furthermore, the digital signal processing unit can be readily fabricated in the form of an integrated circuit. This enables further miniaturization and enhances reliability. Since the algorithm performed by the digital signal processing unit can be easily modified, a compensation can be easily made to improve the stability of the vector ammeter.

The configuration of the digital signal processing units 23 and 33 in the above embodiments should not be construed as limiting the present invention. Algorithms differing from the algorithm used in the illustrated embodiments can be performed to have advantages other than the advantages yielded by the illustrated examples with some compromises. $Y_\gamma$ and K generally include two-port devices in which the second-order transfer matrix has nonzero non-diagonal elements. Especially, when the phase of the forward amplification path is adjusted, the four matrix elements of K are adjusted.

The foregoing description is offered primarily for purposes of illustration. While a variety of embodiments has been disclosed, it will be readily apparent to those skilled in the art that numerous other modifications and variations not mentioned above can still be made without departing from the spirit and scope of the invention as claimed below.

What is calimed is:

1. A vector ammeter comprising:
   a source for producing an AC reference signal;
   means for coupling the AC reference signal to a device being measured to produce an AC measurement signal;
   an amplifier having an input to which the AC measurement signal is applied;
   an analog-to-digital converter having an input connected to an output of the amplifier;
   digital signal processing means having an input connected to an output of the analog-to-digital converter, the digital signal processing means for decomposing the AC measurement signal into two quadrature components corresponding to the real and imaginary parts of the AC measurement signal;
   at least one digital-to-analog converter having an input connected to an output of the digital signal processing means;
   the amplifier, the analog-to-digital converter, the digital signal processing means, and the digital-to-analog converter being connected in cascade to constitute a forward amplification portion; and
   a feedback circuit inserted between an output of the forward amplification portion and the input of the amplifier;
   the real and imaginary parts of the AC measurement signal reduced by the digital signal processing means comprising data for determining one of a ratio of the AC measurement signal to the AC reference signal and a vector voltage across the device being measured.

2. The vector ammeter of claim 1 wherein the digital signal processing means comprises:
   a pair of digital phase-sensitive detectors having respective inputs connected to the output of the analog-to-digital converter;
   means for applying a digital cosine wave to another input of one of the digital phase-sensitive detectors;
   means for applying a digital sine wave to another input of the other digital phase-sensitive detector;
   the respective phase-sensitive detectors for calculating the product of the respective cosine and sine waves and the output from the analog-to-digital converter;
   a pair of accumulators having respective inputs connected to respective outputs of the digital phase-sensitive detectors, the accumulators for digitally integrating signals at the respective outputs of the digital phase-sensitive detectors; and
   a pair of gain adjusters having respective inputs connected to respective outputs of the accumulataors, the gain adjusters for setting a selectable gain.

3. The vector ammeter of claim 2 wherein there is a pair of digital-to-analog converters and respective outputs of the gain adjusters of the digital signal processing means are connected to respective inputs of the digital-to-analog converters.

4. The vector ammeter of claim 3 wherein the digital-to-analog converters are quadrant multiplication type digital-to-analog converters and wherein the digital-to-analog converters receive the AC reference signal for energizing the device being measured and a signal shifted in phase by 90 degrees with respect to the AC reference signal, respectively.

5. The vector ammeter of claim 4, further comprising a 90-degree phase shifter connected between the source of the AC reference signal and one of the digital-to-analog converters for producing the signal shifted in phase by 90 degrees with respect to the AC reference signal.

6. The vector ammeter of claim 3, further comprising a timing generator for producing a timing signal in synchronism with the AC reference signal.

7. The vector ammeter of claim 2 wherein the digital signal processing means further comprises:
   a pair of demodulating digital modulators having respective inputs connected to respective outputs of the gain adjusters; and
   a digital adder having respective inputs connected to respective outputs of the demodulating digital modulators;
   an output of the adder being connected to the digital-toanalog converter, the digital-to-analog converter for converting the signal produced by the adder into an AC signal proportional to a reference DC signal.

8. The vector ammeter of claim 7, further comprising a timing generator for producing a timing signal in synchronism with the AC reference signal.

9. A vector ammeter comprising:
   a forward amplifier chain which cascades:
   (a) amplifier means to which is input an AC current;
   (b) analog-to-digital converter means;
   (c) digital signal processing means;
   (d) digital-to-analog converter means; and (e) feedback circuit means connected between an output of the digital-to-analog converter means and the input of the amplifier; and characterized in that the digital signal processing means orthogonally decomposes the AC input current into real and imaginary components;

the real and imaginary components of the AC input current comprising data for determining one of a ratio of the AC input current to an AC reference current and a voltage across a device being measured through which the AC input current flows.

10. The vector ammeter of claim 9 wherein the digital signal processing means comprises:

a pair of digital phase-sensitive detectors having respective inputs connected to an output of the analog-to-digital converter;

means for applying a digital cosine wave to another input of one of the digital phase-sensitive detectors;

means for applying a digital sine wave to another input of the other digital phase-sensitive detector;

the respective phase-sensitive detectors for calculating the product of the respective cosine and sine waves and the output from the analog-to-digital converter;

a pair of accumulators having respective inputs connected to respective outputs of the digital phase-sensitive detectors, the accumulators for digitally integrating signals at the respective outputs of the digital phase-sensitive detectors; and a pair of gain adjusters havino respective inputs connected to respective outputs of the accumulators, the gain adjusters for seeking a selectable gain.

11. The vector ammeter of claim 10 wherein the digital-to-analog converter means comprises a pair of digital-to-analog coverters and respective outputs of the gain adjusters of the digital signal processing means are connected to respective inputs of the digital-to-analog converters.

12. The vector ammeter of claim 11 wherein the digital-to-analog converters are quadrant multiplication type digital-to-analog converters and wherein the digital-to-analog converters receive the AC reference current for energizing the device being measured and a signal shifted in phase by 90 degrees with respect to the AC reference current, respectively.

13. The vector ammeter of claim 12, further comprising a 90 degree phase shifter connected between a source of the AC reference current and one of the digital-to-analog converters for producing the signal shifted in phase by 90 degrees with respect to the AC reference current.

14. The vector ammeter of claim 11, further comprising a timing generator for producing a timing signal in synchronism with the AC reference current.

15. The vector ammeter of claim 10 wherein the digital signal processing means further comprises:

a pair of demodulating digital modulators having respective inputs connected to respective outputs of the gain adjusters; and a digital adder having respective inputs connected to respective outputs of the demodulating digital modulators;

an output of the adder being connected to the digital-to-analog converter means, the digital-to-analog converter means for converting the signal produced by the adder into an AC signal proportional to a reference DC signal.

16. The vector ammeter of claim 15, further comprising a timing generator for producing a timing signal in synchronism with the AC reference current.

* * * * *

UNITED STATES PATENT AND TRADEMARK OFFICE
CERTIFICATE OF CORRECTION

PATENT NO. : 4,935,692

DATED : June 19, 1990

INVENTOR(S) : Tomio Wakasugi

It is certified that error appears in the above-identified patent and that said Letters Patent is hereby corrected as shown below:

Column 1, Line 10, "meters The vector" should read -- meters. The vector --;

Column 5, Line 26, "$x(k+1) = \bar{A}(k) + \bar{B}\,U(k)$" should read -- $x(k+1) = \bar{A}\,x(k) + \bar{B}\,U(k)$ --;

Column 6, Line 64, "$U(i) = G_2hu-1\, G_1\, Y(i)$" should read -- $U(i) = G_2^{-1} G_1\, Y(i)$ --;

Column 7, Line 40, "What is calimed is:" should read -- What is claimed is: --;

Column 7, Line 67, "signal reduced by the" should read -- signal produced by the --; and Column 9, Line 30, "adjusters havino respective" should read -- adjusters having respective --.

Signed and Sealed this

Seventeenth Day of March, 1992

Attest:

HARRY F. MANBECK, JR.

*Attesting Officer*   *Commissioner of Patents and Trademarks*